United States Patent
Kurokawa

(10) Patent No.: US 9,653,486 B2
(45) Date of Patent: May 16, 2017

(12) United States Patent

(54) ANALOG/DIGITAL CIRCUIT INCLUDING BACK GATE TRANSISTOR STRUCTURE

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 59 days.

(21) Appl. No.: 14/492,644

(22) Filed: Sep. 22, 2014

(65) Prior Publication Data

US 2015/0091003 A1 Apr. 2, 2015

(30) Foreign Application Priority Data

Sep. 27, 2013 (JP) ................. 2013-200707

(51) Int. Cl.
| | |
|---|---|
| *H01L 29/10* | (2006.01) |
| *H01L 29/12* | (2006.01) |
| *H01L 27/12* | (2006.01) |
| *H01L 29/786* | (2006.01) |

(52) U.S. Cl.
CPC ...... *H01L 27/1225* (2013.01); *H01L 29/7869* (2013.01); *H01L 29/78648* (2013.01); *H01L 29/78696* (2013.01)

(58) Field of Classification Search
CPC ............ H01L 27/1251; H01L 27/1225; H01L 29/78648; H01L 29/7869; H03F 1/00
USPC .......................................................... 257/43
See application file for complete search history.

(56) References Cited

U.S. PATENT DOCUMENTS

| | | | |
|---|---|---|---|
| 4,812,681 | A | 3/1989 | Pumphrey |
| 5,731,856 | A | 3/1998 | Kim et al. |
| 5,744,864 | A | 4/1998 | Cillessen et al. |
| 6,127,702 | A | 10/2000 | Yamazaki et al. |
| 6,294,274 | B1 | 9/2001 | Kawazoe et al. |
| 6,563,174 | B2 | 5/2003 | Kawasaki et al. |

(Continued)

FOREIGN PATENT DOCUMENTS

| | | |
|---|---|---|
| EP | 0291191 | 11/1988 |
| EP | 1737044 A | 12/2006 |

(Continued)

OTHER PUBLICATIONS

MOSFET, https://en.wikipedia.org/wiki/MOSFET, Dec. 29, 2015.*
(Continued)

*Primary Examiner* — Robert Huber
(74) *Attorney, Agent, or Firm* — Robinson Intellectual Property Law Office; Eric J. Robinson

(57) ABSTRACT

To provide a semiconductor device with low power consumption. In transistors electrically connected to function as a comparator circuit, back gates are provided in the transistors functioning as current sources, and the transistors functioning as the current sources can be switched between conduction and non-conduction in accordance with a control signal supplied to the back gates. The control signal makes the transistor conductive in a period during which the comparator circuit operates and non-conductive in the other period. A semiconductor layer to be a channel formation region of the transistor included in the semiconductor device includes an oxide semiconductor.

18 Claims, 14 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258826 A1* | 10/2008 | Chatterjee ............ H03F 3/45071 331/108 R |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0198484 A1* | 8/2011 | Kurokawa ............ H01L 27/146 250/214 R |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-288512 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2008, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Display", Am-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT"SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest'08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies In ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. pp. 1-4.
Jin.D et al., "65.2:Distinguished Paper:World-Largest (6.5") Flexible Full Color Top Emission AMOLED Display on Plastic film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digst '07 : SID International Sympsium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Tansistors Using Amorphous Oxife Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Ishii.T et al., "A Poly-Silicon TFT With a Sub-5-nm Thick Channel for Low-Power Gain Cell Memory in Mobile Applications,", IEEE Transactons on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's ,", IEEE Transactions on Electron Devices, Jun. 1, 1994, vol. 41, No. 6, pp. 926-931.

* cited by examiner

ADC

DAC understand # ANALOG/DIGITAL CIRCUIT INCLUDING BACK GATE TRANSISTOR STRUCTURE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a memory device, a driving method thereof, or a manufacturing method thereof. In particular, one embodiment of the present invention relates to a semiconductor device and an analog/digital converter circuit including the semiconductor device.

2. Description of the Related Art

A semiconductor device which is constituted only by n-channel transistors and functions as a comparator circuit is known (see Patent Document 1).

REFERENCE

Patent Document

[Patent Document 1] Japanese Published Patent Application No. S63-288512

SUMMARY OF THE INVENTION

In a structure disclosed in Patent Document 1, a depletion type transistor and an enhancement type transistor are used together. In other words, transistors having different threshold voltages need to be provided, which complicates the process. Since a depletion type transistor is used, current always flows and thus the power consumption is increased.

Furthermore, in a semiconductor device, stable operation in a high-temperature environment is required. However, in a transistor in which silicon (Si) is used for a semiconductor layer to be a channel formation region (hereinafter referred to as a Si transistor), the off-state current is increased at a high temperature; thus, an on/off ratio required for operation cannot be obtained and a malfunction is caused.

In view of the above, an object of one embodiment of the present invention is to provide a novel-structured semiconductor device with excellent heat resistance. Another object of one embodiment of the present invention is to provide a novel-structured semiconductor device with excellent tolerance to a high voltage. Another object of one embodiment of the present invention is to provide a novel-structured semiconductor device which achieves low power consumption.

Note that the descriptions of these objects do not disturb the existence of other objects. In one embodiment of the present invention, there is no need to achieve all the objects. Objects other than the above objects will be apparent from and can be derived from the descriptions of the specification, the drawings, the claims, and the like.

According to one embodiment of the present invention, a semiconductor device compares a first signal and a second signal and outputs an output signal corresponding to the comparison. The semiconductor device includes, between power supply lines, a first transistor and a second transistor which are electrically connected in series, a third transistor and a fourth transistor which are electrically connected in series, a fifth transistor and a sixth transistor which are electrically connected in series, and a seventh transistor and an eighth transistor which are electrically connected in series. A gate of the first transistor, a gate of the third transistor, a gate of the fifth transistor, a second terminal of the third transistor, and a first terminal of the fourth transistor are electrically connected to one another. A second terminal of the first transistor, a first terminal of the second transistor, and a gate of the fourth transistor are electrically connected to one another. The first signal is supplied to a gate of the second transistor. The second signal is supplied to a gate of the sixth transistor. A second terminal of the fifth transistor, a first terminal of the sixth transistor, and a gate of the eighth transistor are electrically connected to one another. A gate of the seventh transistor, a second terminal of the seventh transistor, and a first terminal of the eighth transistor are electrically connected to one another and output the output signal. Each of the first transistor, the third transistor, the fifth transistor, and the seventh transistor includes a back gate and is switched between conduction and non-conduction in accordance with a control signal supplied to the back gate.

According to one embodiment of the present invention, a novel-structured semiconductor device having excellent heat resistance can be provided. According to another embodiment of the present invention, a novel-structured semiconductor device having excellent tolerance to a high voltage can be provided. According to another embodiment of the present invention, a novel-structured semiconductor device which achieves low power consumption can be provided. Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

DETAILED DESCRIPTION OF THE INVENTION

Figure 1:
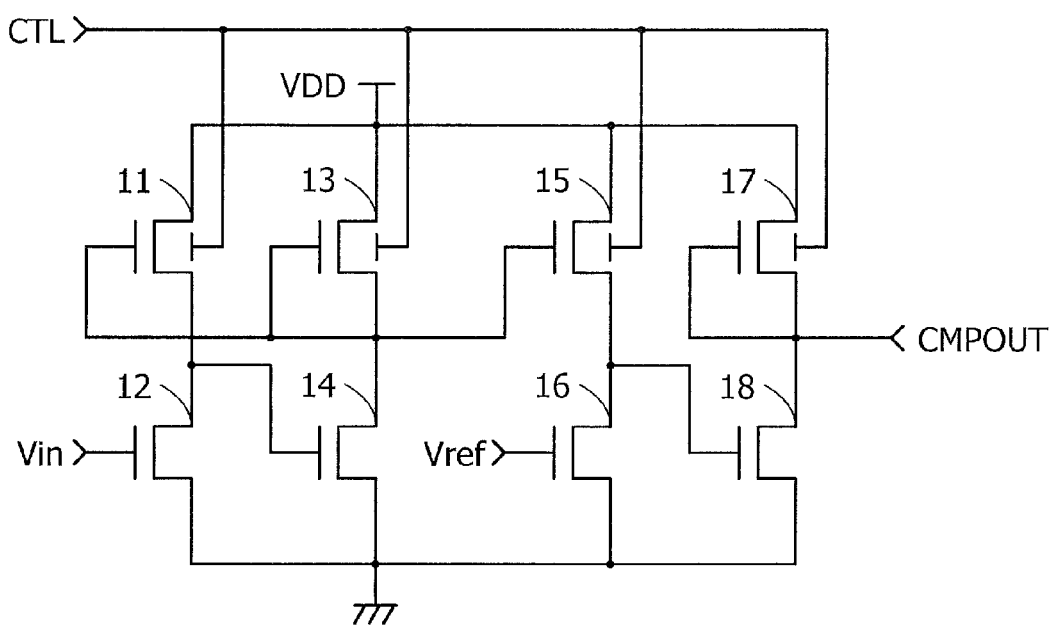
FIG. 1 is a circuit diagram of one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the reference drawings, the size, the thickness of layers, or regions may be exaggerated for clarity in some cases. Therefore, embodiments of the present invention are not limited to such a scale. Note that drawings are schematic views of ideal examples, and the embodiments of the present invention are not limited to the shape or the value illustrated in the drawings. For example, variation in signal, voltage, or current due to noise or a difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on a structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first terminal and the other is referred to as a second terminal.

Note that in this specification and the like, ordinal numbers such as "first", "second", and "third" are used in order to avoid confusion among components, and thus do not limit the number of the components.

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

In this specification and the like, terms for describing arrangement, such as "over" and "under", are used for convenience for describing the positional relation between components with reference to drawings. Furthermore, the positional relation between components is changed as appropriate in accordance with a direction in which each component is described. Thus, the positional relation is not limited to that described with a term used in this specification and can be explained with another term as appropriate depending on the situation.

In this specification and the like, the layout of circuit blocks in a drawing specifies the positional relationship for description. Thus, even when a drawing shows that different functions are achieved in different circuit blocks, an actual circuit or region may be configured so that the different functions are achieved in the same circuit or region. In addition, functions of circuit blocks in diagrams are specified for description, and even in the case where one circuit block is illustrated, blocks may be provided in an actual circuit or region so that processing performed by one circuit block is performed by a plurality of circuit blocks.

In this specification and the like, voltage often refers to a potential difference between a given potential and a reference potential (e.g., a ground potential). Accordingly, the voltage, the potential, and the potential difference can also be referred to as a potential, a voltage, and a voltage difference, respectively. Note that a voltage refers to a difference between potentials of two points, and a potential refers to electrostatic energy (electric potential energy) of a unit electric charge at a given point in an electrostatic field.

In this specification and the like, the term "parallel" indicates that the angle formed between two straight lines ranges from $-10°$ to $10°$, and accordingly also includes the case where the angle ranges from $-5°$ to $5°$. In addition, the term "perpendicular" indicates that the angle formed between two straight lines ranges from $80°$ to $100°$, and accordingly includes the case where the angle ranges from $85°$ to $95°$.

In this specification and the like, trigonal and rhombohedral crystal systems are included in a hexagonal crystal system.

Embodiment 1

In this embodiment, a circuit configuration of a semiconductor device, and an analog/digital converter circuit including the semiconductor device and operation thereof are described.

Note that a semiconductor device refers to a device including a semiconductor element. The semiconductor device includes a driver circuit for driving a circuit including a semiconductor element, for example. Note that a semiconductor device may include a driver circuit, a power supply circuit, or the like provided over a substrate which is different from a substrate provided with the semiconductor device.

FIG. 1 is a circuit diagram illustrating an example of a semiconductor device of one embodiment of the present invention. The semiconductor device shown in FIG. 1 can serve as a comparator circuit that compares a first signal and a second signal and obtains a signal based on the comparison.

A semiconductor device CMP shown in FIG. 1 includes a transistor 11 (also referred to as a first transistor), a transistor 12 (also referred to as a second transistor), a transistor 13 (also referred to as a third transistor), a transistor 14 (also referred to as a fourth transistor), a transistor 15 (also referred to as a fifth transistor), a transistor 16 (also referred to as a sixth transistor), a transistor 17 (also referred to as a seventh transistor), and a transistor 18 (also referred to as an eighth transistor). The transistors 11 to 18 have the same polarity. Note that the transistors 11 to 18 are n-channel transistors in FIG. 1.

The transistors 11 to 18 are provided between power supply lines for supplying power supply voltage. The transistor 11 and the transistor 12 which are electrically connected to each other in series, the transistor 13 and the transistor 14 which are electrically connected to each other in series, the transistor 15 and the transistor 16 which are electrically connected to each other in series, and the transistor 17 and the transistor 18 which are electrically connected to each other in series are provided between the power supply lines.

The transistors 11 and 12, the transistors 13 and 14, the transistors 15 and 16, and the transistors 17 and 18 constitute inverters. The transistors 11, 13, 15, and 17 each have a function of a depletion type transistor. In other words, the transistors 11, 13, 15, and 17 each function as a current source. The transistors 12, 14, 16, and 18 each function as an enhancement type transistor.

A first terminal of the transistor 11, a first terminal of the transistor 13, a first terminal of the transistor 15, and a first terminal of the transistor 17 are connected to a wiring for supplying a high power supply potential VDD. A gate of the transistor 11, a gate of the transistor 13, a gate of the transistor 15, a second terminal of the transistor 13, and a first terminal of the transistor 14 are connected to one another. A second terminal of the transistor 11, a first terminal of the transistor 12, and a gate of the transistor 14 are connected to one another. A second terminal of the transistor 15, a first terminal of the transistor 16, and a gate of the transistor 18 are connected to one another. A gate of the transistor 17, a second terminal of the transistor 17, and a first terminal of the transistor 18 are connected to one another. A second terminal of the transistor 12, a second terminal of the transistor 14, a second terminal of the transistor 16, and a second terminal of the transistor 18 are connected to a ground line for supplying a ground potential.

The semiconductor device CMP shown in FIG. 1 is supplied with an input voltage Vin based on the first signal and a reference voltage Vref based on the second signal and outputs a signal CMPOUT. A gate of the transistor 12 is supplied with the input voltage Vin. A gate of the transistor 16 is supplied with the reference voltage Vref. The signal CMPOUT is output from the gate of the transistor 17, the second terminal of the transistor 17, and the first terminal of the transistor 18.

FIG. 1 shows an example where power supply voltage is supplied to the inverter owing to the high power supply potential VDD and the ground potential. Note that in general, potential and voltage are relative values. Therefore, ground potential is not always 0 V.

In the semiconductor device CMP of one embodiment of the present invention which is shown in FIG. 1, the transistors 11, 13, 15, and 17 include back gates. When the back gates are controlled by a control signal CTL supplied as voltages of the back gates, the transistors 11, 13, 15, and 17 can be depletion type transistors.

In the semiconductor device CMP of one embodiment of the present invention which is shown in FIG. 1, a voltage of the control signal CTL supplied to the back gate is switched depending on whether the semiconductor device CMP operates or not. Specifically, in the case where the semiconductor device CMP operates, that is, the case where the semiconductor device CMP compares the first signal and the second signal and obtains a signal based on the comparison, a voltage to be supplied as the control signal CTL is switched so that the transistors 11, 13, 15, and 17 become depletion type transistors and turned on. In that case, a positive potential is supplied to the back gate electrodes of the transistors 11, 13, 15, and 17. When the semiconductor device CMP does not operate, a voltage to be supplied as the control signal CTL is switched so that the transistors 11, 13, 15, and 17 are turned off. In that case, 0 or negative potentials are supplied to the back gate electrodes of the transistors 11, 13, 15, and 17.

With such a structure, the transistors functioning as current sources can be switched between the on state and the off state in accordance with the control signal CTL supplied to the back gates. Thus, the semiconductor device CMP can operate as a comparator circuit in operation and can suppress flow-through current of the inverter in non-operation. Therefore, according to one embodiment of the present invention, a semiconductor device which achieves low power consumption can be provided.

It is difficult to employ such a structure in the case where Si enhancement type transistors and Si depletion type transistors are formed separately by introducing impurity elements to semiconductor layers. According to one embodiment of the present invention, each of the transistors is switched between conduction and non-conduction by a voltage supplied to the back gate, which enables low power consumption. Thus, according to one embodiment of the present invention, an inverter formed of transistors having different threshold voltages can be mounted without complicating the process, and a semiconductor device which achieves low power consumption can be provided.

In one embodiment of the present invention, the transistors 11 to 18 are n-channel transistors. In the case where the transistors 11 to 18 are p-channel transistors, signals supplied to wirings may be inverted.

There is no particular limitation on the semiconductor layers of the transistors 11 to 18, and a semiconductor such as amorphous silicon, microcrystalline silicon, polycrystalline silicon, single crystal silicon, amorphous germanium, microcrystalline germanium, polycrystalline germanium, or single crystal germanium can be used as an example. Alternatively, a compound semiconductor such as an oxide semiconductor or a nitride semiconductor, an organic semiconductor, or the like can be used.

In particular, a semiconductor layer of the transistor of one embodiment of the present invention is preferably formed using an oxide semiconductor. When an oxide semiconductor is used for the transistors 11 to 18 of one embodiment of the present invention, the threshold voltages can be controlled by the control signal CTL supplied to the back gates and the transistors can have excellent heat resistance and tolerance to voltage.

Figure 2A:
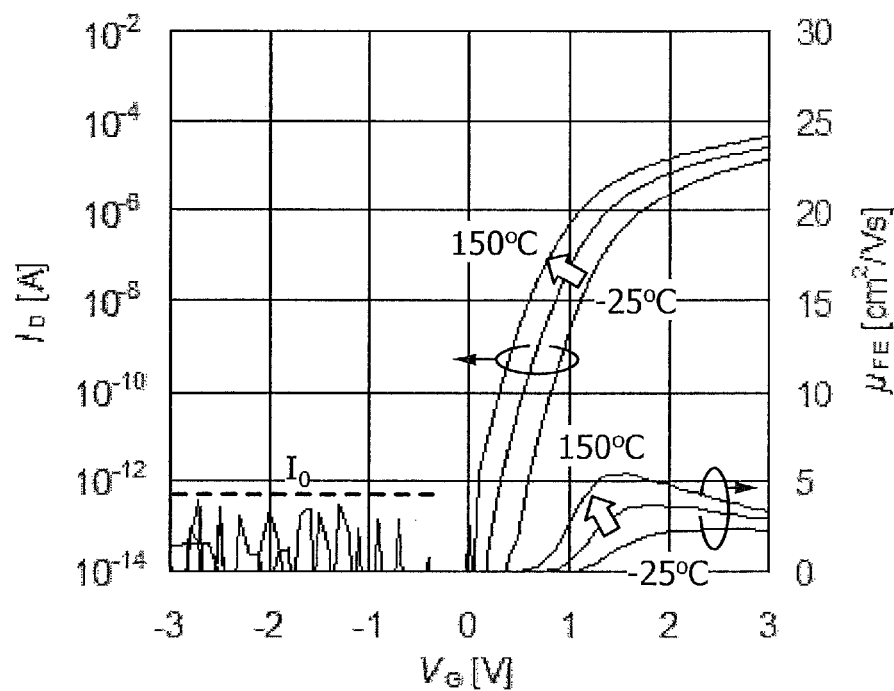
FIGS. 2A and 2B are graphs each showing temperature characteristics of transistors.
Figure 2B:
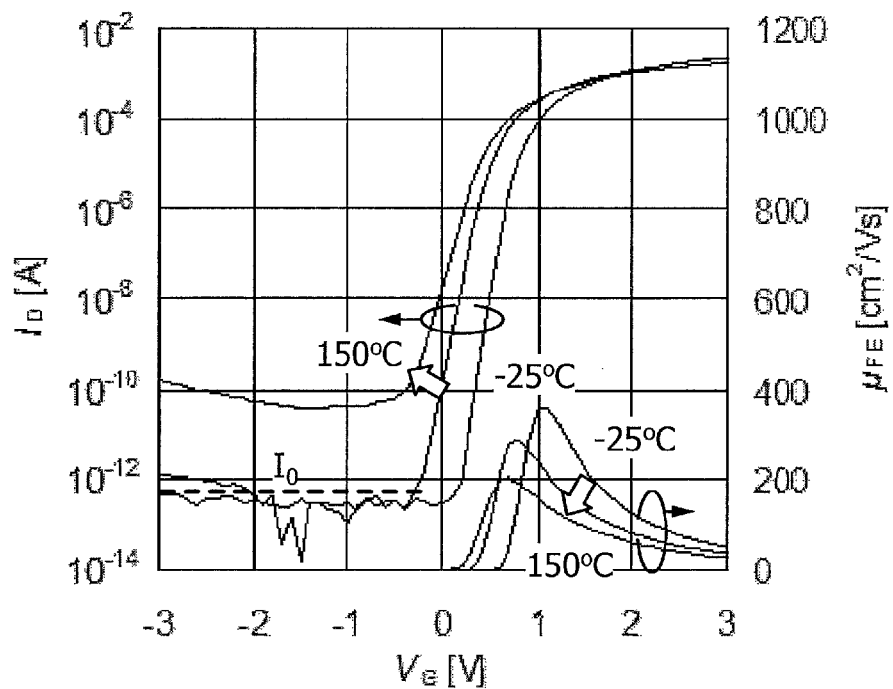

A transistor (hereinafter also referred to as an OS transistor) in which a semiconductor layer to be a channel formation region of the transistor is formed using an oxide semiconductor can be used at a higher temperature than a Si transistor. As specific examples, FIG. 2$a$ shows temperature dependence of gate voltage $V_G$-drain current $I_D$ characteristics and gate voltage $V_G$-electric field mobility $\mu_{FE}$ characteristics of an OS transistor, and FIG. 2$b$ shows temperature dependence of gate voltage $V_G$-drain current $I_D$ characteristics and gate voltage $V_G$-electric field mobility $\mu_{FE}$ characteristics of a Si transistor. FIGS. 2$a$ and 2$b$ show measurement results of electrical characteristics at temperatures of −25° C., 50° C., and 150° C. Note that the drain voltage $V_D$ is set to 1 V.

FIG. 2$a$ shows electrical characteristics of the OS transistor that has a channel length L of 0.45 μm, a channel width W of 10 μm, and a thickness Tox of an oxide film of a gate insulating layer of 20 nm. FIG. 2$b$ shows electrical characteristics of the Si transistor that has L of 0.35 μm, W of 10 μm, and Tox of 20 nm.

An oxide semiconductor layer in the OS transistor is made of an In—Ga—Zn-based oxide. The Si transistor is formed using a silicon wafer.

FIGS. 2$a$ and 2$b$ show that the OS transistor has low temperature dependence of rising gate voltage. The off-state current of the OS transistor is lower than or equal to the lower measurement limit ($I_O$) independently of temperature. On the contrary, the off-state current of the Si transistor largely depends on the temperature. According to the measurement results of FIG. 2$b$, at 150° C., the off-state current of the Si transistor rises, and a sufficiently high current on/off ratio cannot be obtained.

As shown in the graphs of FIGS. 2$a$ and 2$b$, when including the OS transistor, the semiconductor device CMP can operate even at a temperature lower than or equal to 150° C. Therefore, the semiconductor device CMP including the OS transistor can have high heat resistance.

Since the OS transistor has a higher bandgap than the Si transistor by approximately 1 eV to 2 eV, an avalanche breakdown hardly occurs and electrical tolerance to an electric field is high. Therefore, when the transistors 11 to 18 are OS transistors, the semiconductor device CMP can have excellent tolerance.

The OS transistor can have an extremely low off-state current. By using OS transistors as the transistors 11 to 18, when the semiconductor device CMP does not operate, the amount of flow-through current through an inverter can be significantly reduced. Therefore, according to one embodiment of the present invention, a semiconductor device which achieves low power consumption can be provided.

Here, low off-state current means that a normalized off-state current per micrometer in channel width at room temperature is lower than or equal to 10 zA/μm. Since the off-state current is preferably as low as possible, the normalized off-state current is preferably lower than or equal to 1 zA/μm, more preferably lower than or equal to 10 yA/μm, still more preferably lower than or equal to 1 yA/μm. Note that a voltage between a source and a drain in that case is, for example, approximately 0.1 V, 5 V, or 10 V.

Note that in the semiconductor device CMP, the transistors 11, 13, and 15 have the same gate potential and operate in a saturation region. In the case where the potential of the input voltage Vin is equal to the potential of the reference voltage Vref, the sizes of the transistors 17 and 18 are designed so that an intermediate potential of a power supply voltage is output as the voltage of the signal CMPOUT of the semiconductor device CMP.

Here, operation of the semiconductor device CMP will be briefly described. In the case where the potential of the input voltage Vin is higher than the potential of the reference voltage Vref, a current flowing in the transistors 11, 13, and 15 is higher than that in the case where the potential of the input voltage Vin is equal to the potential of the reference voltage Vref. Accordingly, the voltage of the first terminal of the transistor 16, that is, the voltage of the gate of the transistor 18, becomes high; thus, the signal CMPOUT is set to "L".

In contrast, in the case where the potential of the input voltage Vin is lower than the potential of the reference voltage Vref, a current flowing in the transistors 11, 13, and 15 is lower than that in the case where the potential of the input voltage Vin is equal to the potential of the reference potential Vref. Accordingly, the voltage of the first terminal of the transistor 16, that is, the voltage of the gate of the transistor 18, becomes low; thus, the signal CMPOUT is set to "H".

As described above, the semiconductor device shown in FIG. 1 can have excellent heat resistance and tolerance, and low power consumption.

Figure 3:
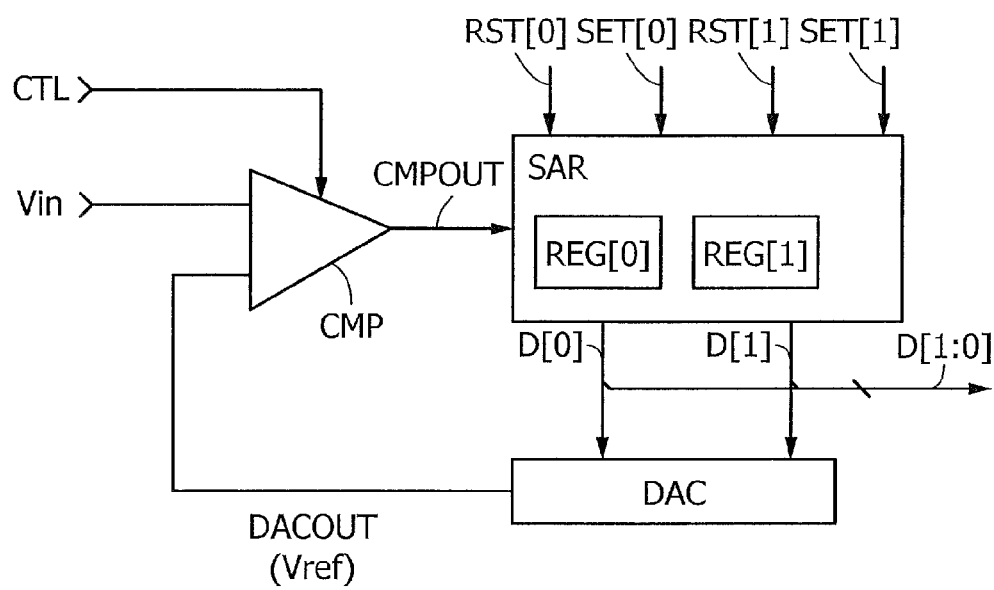
FIG. 3 is a block diagram of one embodiment of the present invention.

Next, an analog/digital converter circuit including the semiconductor device CMP shown in FIG. 1 is described. FIG. 3 is a block diagram illustrating a configuration of the analog/digital converter circuit.

The analog/digital converter circuit ADC shown in FIG. 3 includes the semiconductor device CMP functioning as a comparator circuit, a successive approximation register SAR, and a digital/analog converter circuit DAC.

The analog/digital converter circuit ADC has a function of converting an analog signal to a digital signal.

The semiconductor device CMP is a circuit having a function of comparing the input voltage Vin and a signal DACOUT output from the digital/analog converter circuit DAC as the reference voltage Vref and outputting the signal CMPOUT corresponding to the comparison result.

Note that the semiconductor device CMP has the configuration shown in FIG. 1. As shown in FIG. 1, the control signal CTL is supplied to the semiconductor device CMP. The control signal CTL is a signal which is changed so that a positive potential is supplied to the back gate electrodes of the transistors 11, 13, 15, and 17 when the semiconductor device CMP operates and changed so that 0 or a negative potential is supplied to the back gate electrodes when the semiconductor device CMP does not operate. The semiconductor device CMP can switch between conduction and non-conduction of transistors functioning as current sources in accordance with the control signal CTL supplied to the back gates. Therefore, the semiconductor device CMP can operate as a comparator circuit in operation and can suppress flow-through current of the inverter in non-operation.

The successive approximation register SAR includes a register REG. The register REG is provided according to the number of bits of the digital signal output from the analog/digital converter circuit ADC. A reset signal RST and a set signal SET are supplied to control registers REG. The successive approximation register SAR is a circuit having a function of outputting output D and inverted output DB which correspond to the number of bits of the digital signal output from the analog/digital converter circuit ADC, in accordance with the signal CMPOUT. Note that the output D is a digital signal output from the analog/digital converter circuit ADC.

The digital/analog converter circuit DAC has a function of outputting the signal DACOUT which is an analog signal in accordance with the output D and the inverted output DB which are obtained from the successive approximation register SAR.

Note that the analog/digital converter circuit ADC outputs a 2-bit digital signal as an example in FIG. 3. The reset signal RST and the set signal SET are therefore represented by RST[1:0] (RST[0] and RST[1]) and SET[1:0] (SET[0] and SET[1]), respectively, in FIG. 3. The output D is represented by output D[1:0]. The register REG is represented by REG[0] and REG[1].

Figure 12:
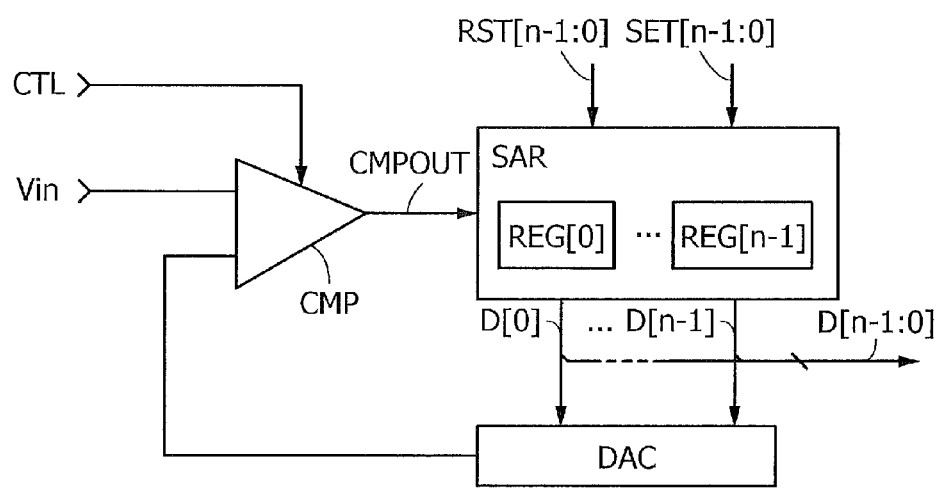
FIG. 12 is a block diagram of one embodiment of the present invention.

The analog/digital converter circuit ADC may output a 3-bit or more digital signal. FIG. 12 shows an analog/digital converter circuit ADC outputting n-bit (n is a natural number of 2 or more) digital signal. The reset signal RST and the set signal SET are represented by RST[n−1:0] and SET[n−1:0], respectively, in FIG. 12. The output D is represented by output D[n−1:0]. The register REG is represented by REG [0] to REG[n−1].

Figure 4:
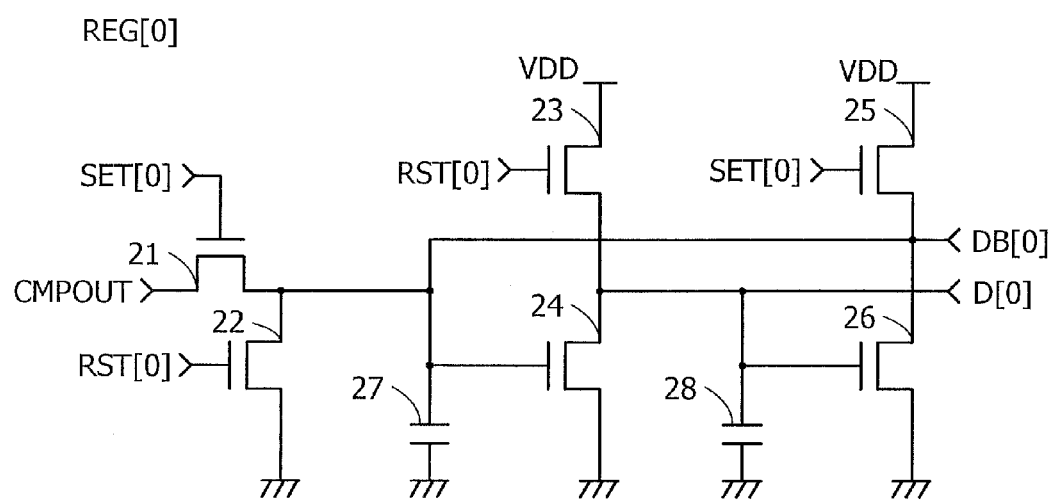
FIG. 4 is a circuit diagram of one embodiment of the present invention.

Next, FIG. 4 is a circuit diagram illustrating an example of the register REG[0] included in the successive approximation register SAR. FIG. 4 is a circuit diagram of the register REG[0] which is supplied with the reset signal RST[0] and the set signal SET[0] and outputs the output D[0] and the inverted output DB[0].

The register REG[0] shown in FIG. 4 includes transistors 21 to 26, a capacitor 27, and a capacitor 28. By setting the reset signal RST[0] to "H", "H" is output to the output D[0] and "L" is output to the inverted output DB[0]. After the reset signal RST[0] is set from "H" to "L", the set signal SET[0] is set to "H", so that signals "H" and "L" or "L" and "H" corresponding to data supplied to the signal CMPOUT are output as the output D[0] and the inverted output DB[0]. Specifically, in the case where the signal CMPOUT is "H", "L" is output to the output D[0] and "H" is output to the inverted output DB[0], and in the case where the signal CMPOUT is "L", "H" is output to the output D[0] and "L" is output to the inverted output DB[0]. Note that in the case where an effective potential is not supplied to the signal CMPOUT the case where the signal CMPOUT is in an electrically floating state), the set signal SET[0] is set to "H", so that "L" is output to the output D[0] and "H" is output to the inverted output DB[0].

When OS transistors are used as the transistors 21 to 26 of the register REG included in the successive approximation register SAR, like the semiconductor device CMP, the successive approximation register SAR can have excellent heat resistance and tolerance to voltage.

Figure 5:
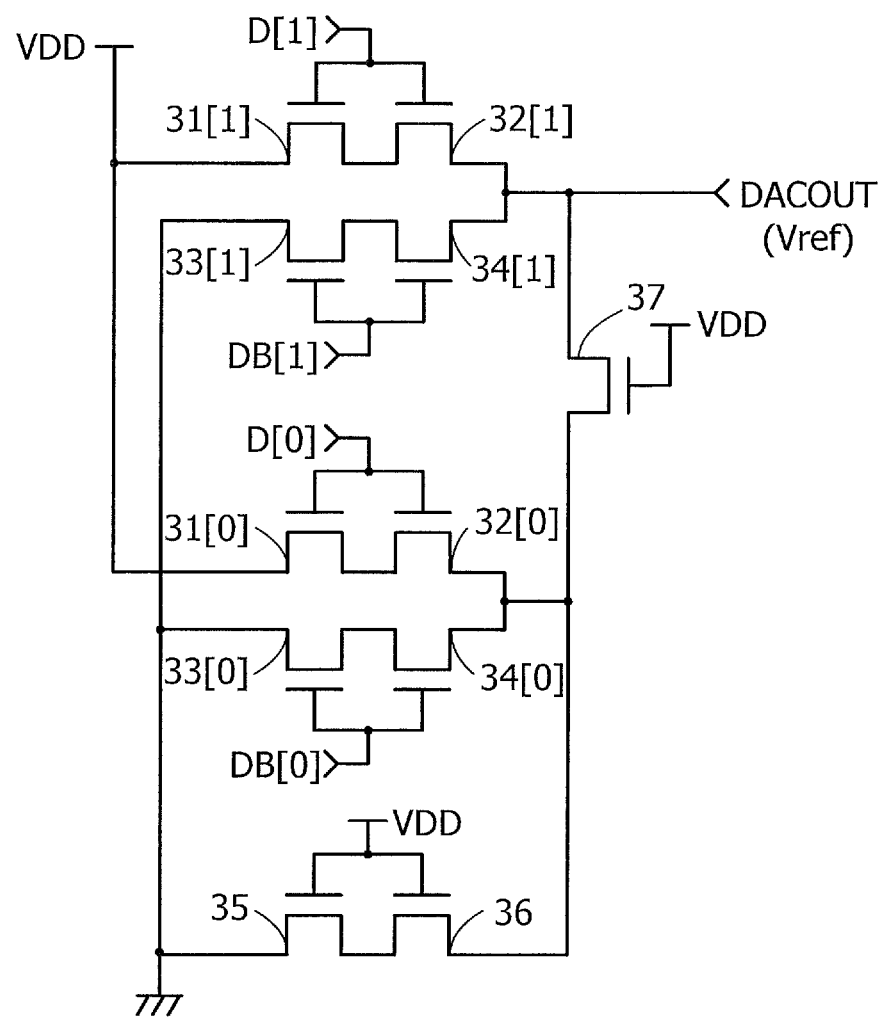
FIG. 5 is a circuit diagram of one embodiment of the present invention.

Next, FIG. 5 is a circuit diagram illustrating an example of the digital/analog converter circuit DAC. In FIG. 5, a digital/analog converter circuit DAC converting a 2-bit digital signal to an analog signal is described as an example.

The digital/analog converter circuit DAC shown in FIG. 5 includes transistors 31[1] to 34[1], transistors 31[0] to 34[0], and transistors 35 to transistor 37. Here, resistances of the transistors which are supplied with the output D[0], the inverted output DB[0], the output D[1], and the inverted output DB[1] are set to twice the resistance of the transistor 37. Here, the transistors 31[1] and 32[1], the transistors 33[1] and 34[1], the transistors 31[0] and 32[0], the transistors 33[0] and 34[0], and the transistors 35 and 36 are connected in series to each other so that the resistances thereof are twice the resistance of the transistor 37. Note that the resistance can be twice the resistance of the transistor 37 by setting the channel width of a transistor electrically connected in parallel to the transistors which are supplied with the output D[0], the inverted output DB[0], the output D[1], and the inverted output DB[1] to ½ of the channel width of the transistor 37.

When OS transistors are used as the transistors 31[1] to 34[1], the transistors 31[0] to 34[0], and the transistors 35 to 37 which are included in the digital/analog converter circuit DAC, like the semiconductor device CMP, the digital/analog converter circuit DAC can have excellent heat resistance and tolerance to voltage.

In the digital/analog converter circuit DAC in FIG. 5, in the case where the output D[1:0]=(L,L), (L,H), (H,L), and (H,H), in other words, the case where the inverted output DB[1:0]=(H,H), (H,L), (L,H), and (L,L), an analog signal can be output so that the DACOUT=0 V, (¼) V, (²⁄₄) V, and (¾) V, respectively, where V denotes the power supply voltage.

Figure 13:
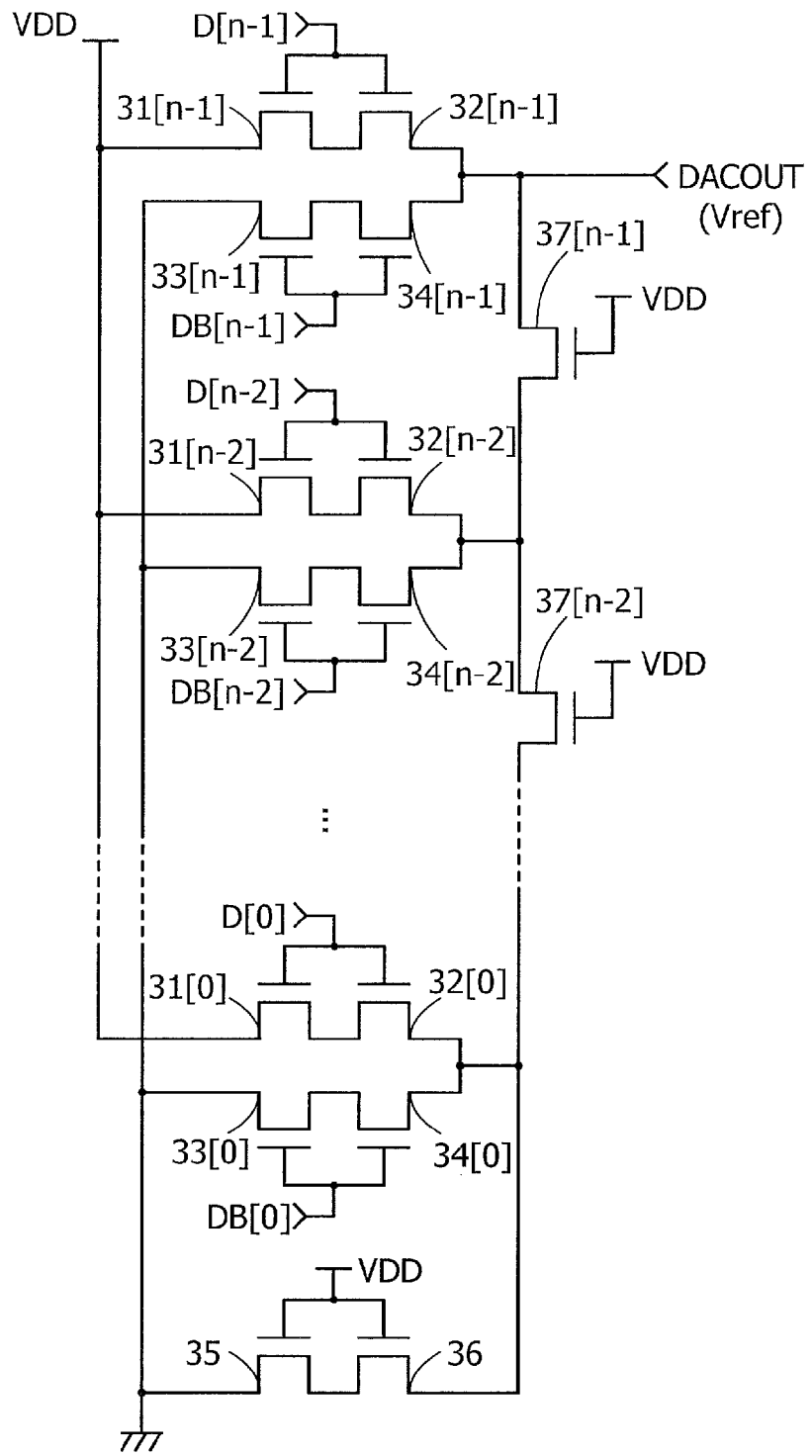
FIG. 13 is a circuit diagram of one embodiment of the present invention.

Note that the digital/analog converter circuit DAC may convert a 3-bit or more digital signal to an analog signal. FIG. 13 shows a digital/analog converter circuit DAC which converts an n-bit digital signal to an analog signal. In FIG. 13, transistors connected in series are represented by transistors 31[n–1] to 34[n–1], transistors 31[0] to 34[0], and the transistors 35 and 36. In FIG. 13, the transistor 37 is represented by transistors 37[n–1] and 37[n–2].

Next, operation of the analog/digital converter circuit ADC is described with reference to a timing chart in FIG. 6. For description, a voltage to be measured corresponding to the input voltage Vin is 1.5 V and a power supply voltage of the digital/analog converter circuit DAC is 4 V. In other words, the digital/analog converter circuit DAC can output analog voltages of 0 V, 1 V, 2 V, and 3 V.

From Time T1 to Time T2, the set signals SET[1:0] are set to "H". At this time, since the control signal CTL is "L", the semiconductor device CMP does not operate; thus, an effective output is not obtained. Since effective data is not supplied to the signal CMPOUT of the register REG in the successive approximation register SAR, "L" is output to the outputs D[1:0] and "H" is output to the inverted outputs DB[1:0]. Note that the reference voltage Vref corresponding to the output of the digital/analog converter circuit DAC is set to 0 V.

From Time T3 to Time T4, the reset signal RST[1] is set to "H". At this time, since the signal CMPOUT is "H", the output D[1] is set to "H", and the reference voltage Vref corresponding to the output of the digital/analog converter circuit DAC is set to 2 V.

From Time T5 to Time T8 the control signal CTL is set to "H". At this time, although the semiconductor device CMP operates, the input voltage Vin (1.5 V) is lower than the reference voltage Vref (2 V); thus, the signal CMPOUT is set to "H".

From Time T6 to Time T7, the set signal SET[1] is set to "H". At this time, the output D[1] is set to "L" and the inverted output DB[1] is set to "H", and the reference voltage Vref corresponding to the output of the digital/analog converter circuit DAC is set to 0 V.

From Time T9 to Time T10, the reset signal RST[0] is set to "H". At this time, the output D[0] is set to "H", and the reference voltage Vref corresponding to the output of the digital/analog converter circuit DAC is set to 1 V.

From Time T11 to Time T14, the control signal CTL is set to "H". At this time, although the semiconductor device CMP operates, the input voltage Yin (1.5 V) is higher than the reference voltage Vref (1 V); thus, the signal CMPOUT is set to "L".

From Time T12 to Time T13, the set signal SET[0] is set to "H". At this time, since the signal CMPOUT is "L", the output D[0] remains "H" and the inverted output DB[0] remains "L", and the reference voltage Vref corresponding to the output of the digital/analog converter circuit DAC remains 1 V.

From the above results, (L,H) is output as analog/digital conversion data from the outputs D[1:0] of the analog/digital converter circuit ADC.

Figure 6:
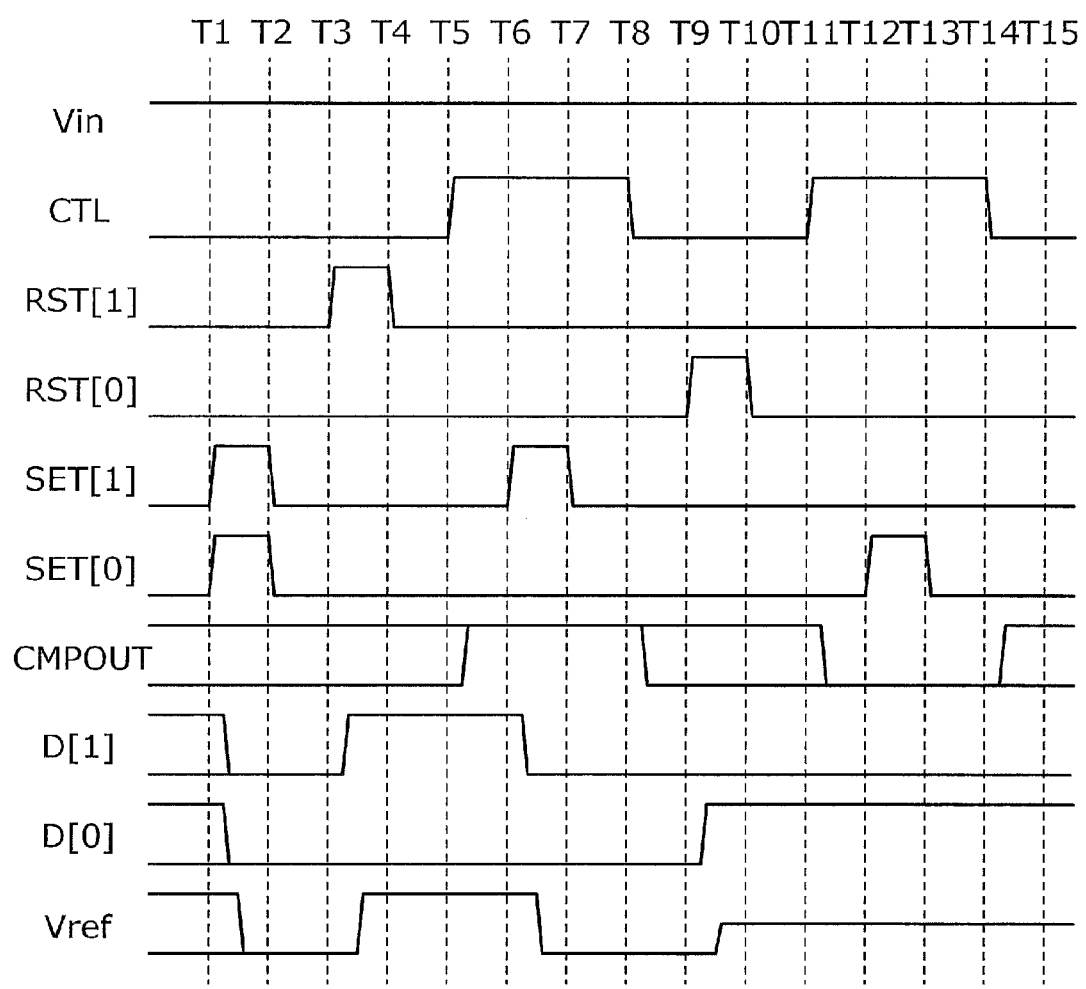
FIG. 6 is a timing chart of one embodiment of the present invention.

In the timing chart of the analog/digital converter circuit ADC of one embodiment of the present invention in FIG. 6, the voltage of the control signal CTL is switched between operation and non-operation of the semiconductor device CMP. With such a structure, in accordance with the control signal CTL supplied to the back gates, the transistors functioning as current sources are switched between conduction and non-conduction. Accordingly, the semiconductor device CMP can operate as a comparator circuit in operation and can suppress flow-through current of the inverter in non-operation. Therefore, the analog/digital converter circuit ADC achieves low power consumption.

As described above, the semiconductor device described in this embodiment can have excellent heat resistance and tolerance to voltage and achieve low power consumption. When transistors similar to those in the semiconductor device are used for a successive approximation register and a digital/analog converter circuit DAC, an analog/digital converter circuit ADC including the semiconductor device can also have excellent heat resistance and tolerance to voltage and achieve low power consumption.

The structure described in this embodiment can be combined as appropriate with any of the structures described in the other embodiments.

Embodiment 2

In this embodiment, an oxide semiconductor layer that can be used as the semiconductor layer of the transistor described in the above embodiment will be described.

An oxide semiconductor used for a channel formation region in the semiconductor layer of the transistor preferably contains at least indium (In) or zinc (Zn). In particular, the oxide semiconductor preferably contains both In and Zn. A stabilizer for strongly bonding oxygen is preferably contained in addition to In and Zn. As the stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide in which an atomic ratio of In to Ga and Zn is 1:1:1, 3:1:2, or 2:1:3, or an oxide whose composition is in the neighborhood of the above compositions may be used.

When the oxide semiconductor film forming the semiconductor layer contains a large amount of hydrogen, hydrogen and the oxide semiconductor are bonded to each other, so that part of hydrogen serves as a donor to cause generation of an electron which is a carrier. As a result, the threshold voltage of the transistor shifts in the negative direction. Therefore, it is preferable that, after the formation of the oxide semiconductor film, heat treatment for dehydration be performed to remove hydrogen or moisture from the oxide semiconductor film so that the oxide semiconductor film is highly purified to contain impurities as little as possible.

Note that oxygen in the oxide semiconductor film is reduced by the dehydration treatment (dehydrogenation treatment) in some cases. For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off state can be less than or equal to $1\times10^{-18}$ A, preferably less than or equal to $1\times10^{-21}$ A, further preferably less than or equal to $1\times10^{-24}$ A at room temperature (approximately 25° C.); or less than or equal to $1\times10^{-15}$ A, preferably less than or equal to $1\times10^{-18}$ A, further preferably less than or equal to $1\times10^{-21}$ A at 85° C. Note that the off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

Next, a structure of an oxide semiconductor is described.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Furthermore, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

With the use of the CAAC-OS film in a transistor, change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

This embodiment cap be implemented in appropriate combination with any of the other embodiments.

Embodiment 3

In this embodiment, a cross-sectional structure of a transistor included in a semiconductor device of one embodiment of the disclosed invention will be described with reference to drawings.

FIGS. 7a to 7d, FIGS. 8a and 8b, and FIGS. 9a and 9b each illustrate an example of part of a cross-sectional structure of the transistor included in a semiconductor device of one embodiment of the present invention. Note that in this embodiment, as the transistor, a transistor whose semiconductor layer is formed using an oxide semiconductor is formed over a substrate.

Note that in the case of using a transistor including an oxide semiconductor, a semiconductor device having better heat resistance and tolerance to voltage than that using a transistor including silicon can be provided, and an analog/digital converter circuit ADC including the semiconductor device can also be provided.

Figure 7A:
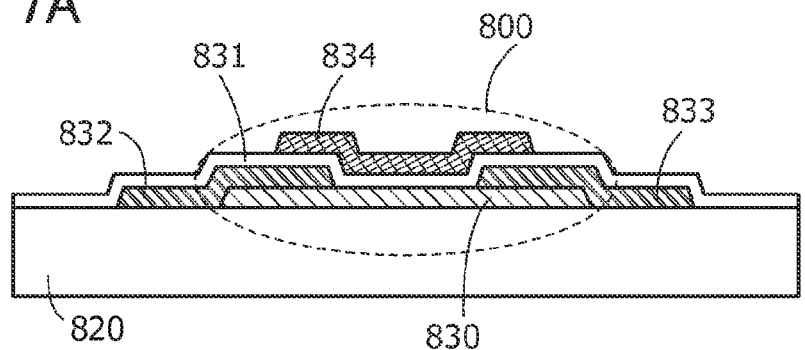
FIGS. 7A to 7D are cross-sectional views of transistors.

In FIG. 7a, an n-channel transistor 800 is formed over a substrate 820. FIG. 7a illustrates a coplanar transistor as an example.

The transistor 800 includes, over the substrate 820, a semiconductor film 830 containing an oxide semiconductor, conductive films 832 and 833 functioning as a source electrode and a drain electrode over the semiconductor film 830, a gate insulating film 831 over the semiconductor film 830 and the conductive films 832 and 833, and a conductive film 834 functioning as a gate electrode that is positioned over the gate insulating film 831 and overlaps with the semiconductor film 830 between the conductive films 832 and 833.

The substrate 820 may be a glass substrate, a ceramic substrate, a quartz substrate, a sapphire substrate, or the like. For example, a single crystal semiconductor substrate or a polycrystalline semiconductor substrate of silicon, silicon carbide, or the like; a compound semiconductor substrate of silicon germanium or the like; an SOI substrate; or the like can be used.

The conductive films 832, 833, and 834 can be formed using a metal material such as molybdenum, titanium, tantalum, tungsten, aluminum, copper, chromium, neodymium, or scandium, or an alloy material containing any of these materials as a main component. The conductive films 832, 833, and 834 may each have a single-layer structure or a stacked-layer structure.

The gate insulating film 831 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 831 may be a stack of any of the above materials.

Figure 7B:
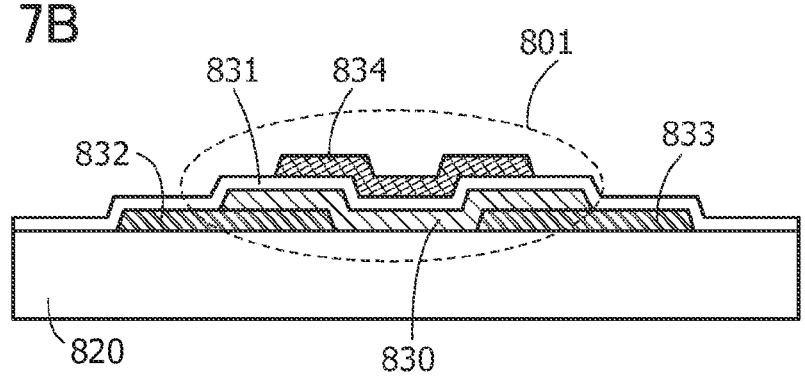

Note that although FIG. 7a illustrates a coplanar transistor, a structure of a staggered transistor like a transistor 801 illustrated in FIG. 7b may also be employed.

In FIG. 7b, the transistor 801 includes, over the substrate 820, the conductive films 832 and 833 functioning as a source electrode and a drain electrode, the semiconductor film 830 containing an oxide semiconductor over the conductive films 832 and 833, the gate insulating film 831 over the semiconductor film 830 and the conductive films 832 and 833, and the conductive film 834 functioning as a gate electrode that is positioned over the gate insulating film 831 and overlaps with the semiconductor film 830 between the conductive films 832 and 833.

Figure 7C:
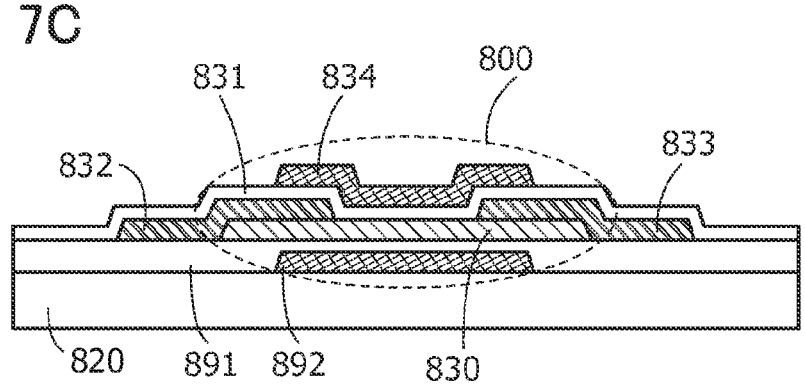
Figure 7D:
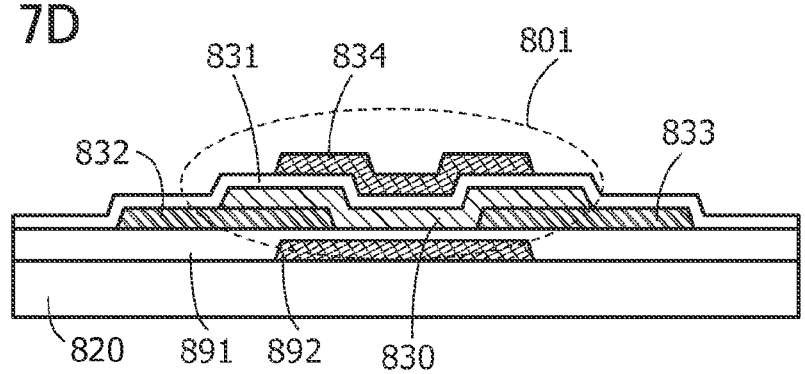

In the case of the transistor including a back gate electrode which is described in the above embodiment, the structures illustrated in FIGS. 7a and 7b may be replaced with structures illustrated in FIGS. 7c and 7d, respectively. Specifically, a conductive film 892 functioning as a back gate electrode may be provided with an insulating film 891 provided therebetween on the substrate 820 side to overlap with the semiconductor film 830 including an oxide semiconductor, and may be supplied with a potential different from that of the conductive film 834.

Figure 14A:
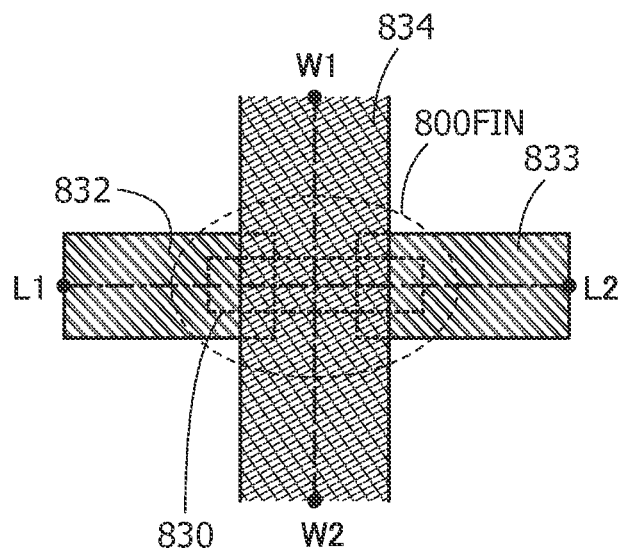
FIGS. 14A and 14B are a top view and a cross-sectional view of a transistor.
Figure 14B:
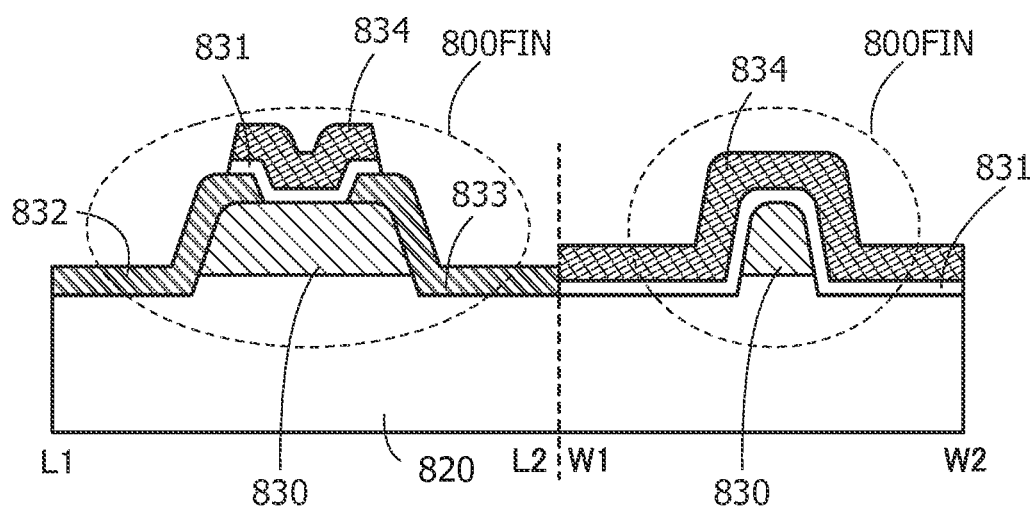

In the case where the transistor illustrated in FIG. 7a has a FIN type structure, a structure illustrated in a top view and a cross-sectional view in FIGS. 14a and 14b may be used. FIG. 14b is a cross-sectional view taken along dashed-dotted lines L1-L2 and W1-W2 in FIG. 14a.

A transistor 800FIN illustrated in FIGS. 14a and 14b includes, over the substrate 820, the semiconductor film 830 including an oxide semiconductor, the conductive film 832 and the conductive film 833 functioning as a source electrode and a drain electrode over the semiconductor film 830 including an oxide semiconductor, the gate insulating film 831 over the semiconductor film 830, the conductive film 832, and the conductive film 833, and the conductive film 834 which is over the gate insulating film 831 and functions as a gate electrode overlapping with the semiconductor film 830 between the conductive film 832 and the conductive film 833.

For the insulating film 891, any of the materials cited in the description of the gate insulating film 831 may be used. For the conductive film 892, any of the materials cited in the descriptions of the conductive films 832, 833, and 834 may be used.

Figure 8A:
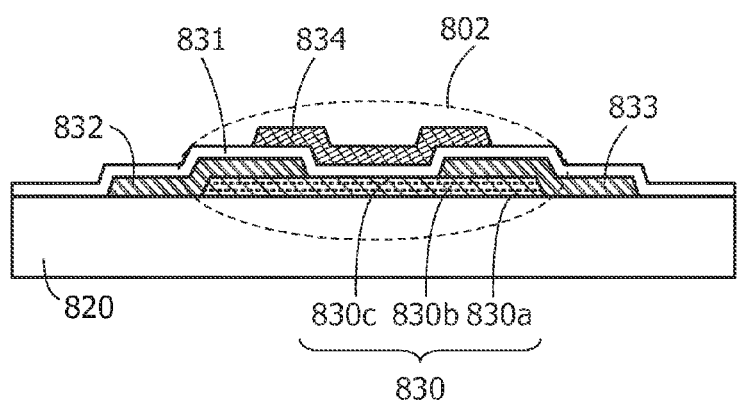
FIGS. 8A and 8B are cross-sectional views of transistors.
Figure 8B:
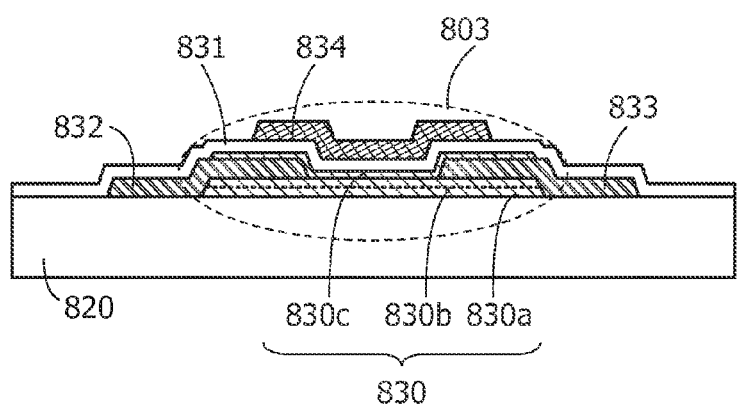

The semiconductor film 830 is not limited to a single oxide semiconductor film and may be a stack including a plurality of oxide semiconductor films. FIGS. 8a and 8b illustrate examples of the structure of the transistor 800 in which the semiconductor film 830 has a three-layer structure.

A transistor 802 illustrated in FIG. 8a includes the semiconductor film 830 over the substrate 820, the conductive films 832 and 833 electrically connected to the semiconductor film 830, the gate insulating film 831, and the conductive film 834 functioning as a gate electrode provided over the gate insulating film 831 so as to overlap with the semiconductor film 830.

As the semiconductor film 830 in the transistor 802, oxide semiconductor films 830a, 830b, and 830c are stacked in this order from the substrate 820 side.

The oxide semiconductor films 830a and 830c are each an oxide film that contains at least one of metal elements contained in the oxide semiconductor film 830b. The energy at the bottom of the conduction band of the oxide semiconductor films 830a and 830c is closer to a vacuum level than that of the oxide semiconductor film 830b by 0.05 eV or more, 0.07 eV or more, 0.1 eV or more, or 0.15 eV or more and 2 eV or less, 1 eV or less, 0.5 eV or less, or 0.4 eV or less. The oxide semiconductor film 830b preferably contains at least indium to increase the carrier mobility.

Note that as in a transistor 803 illustrated in FIG. 8b, the oxide semiconductor film 830c overlapping with the gate insulating film 831 may be partly provided over the conductive films 832 and 833.

Figure 9A:
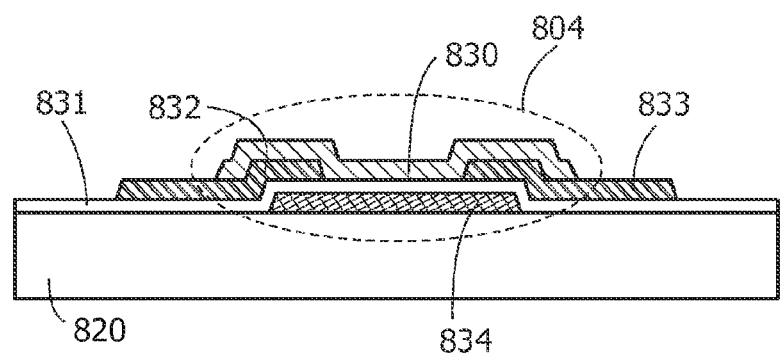
FIGS. 9A and 9B are cross-sectional views of transistors.

Furthermore, as the structure of a transistor provided over the substrate 820, a bottom gate transistor as well as the top gate transistors illustrated in FIGS. 7a and 7b may be employed. FIG. 9a illustrates an inverted coplanar transistor as an example.

A transistor 804 includes, over the substrate 820, the conductive film 834 functioning as a gate electrode, the gate insulating film 831 over the conductive film 834, the conductive films 832 and 833 that are positioned over the gate insulating film 831 and function as a source electrode and a drain electrode, and the semiconductor film 830 over the conductive films 832 and 833.

Figure 9B:
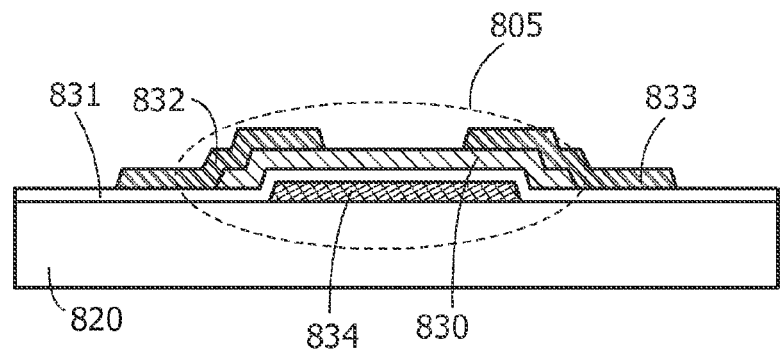

Note that although FIG. 9a illustrates an inverted coplanar transistor, a structure of an inverted staggered transistor like a transistor 805 illustrated in FIG. 9b may also be employed.

The transistor 805 includes, over the substrate 820, the conductive film 834 functioning as a gate electrode, the gate insulating film 831 over the conductive film 834, the semiconductor film 830 over the gate insulating film 831, and the conductive films 832 and 833 that are positioned over the semiconductor film 830 and function as a source electrode and a drain electrode.

This embodiment can be implemented in appropriate combination with any of the other embodiments.

Embodiment 4

In this embodiment, application examples of the semiconductor device described in the foregoing embodiments to an electronic component and to an electronic device including the electronic component will be described with reference to FIGS. 10a and 10b and FIGS. 11a to 11e.

Figure 10A:
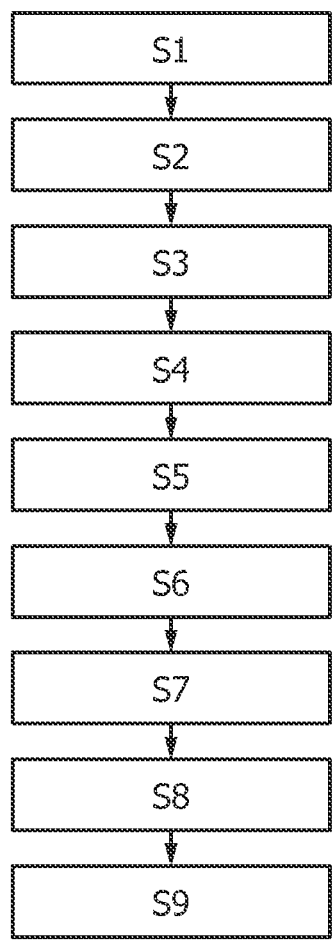
FIG. 10A is a flow chart illustrating manufacturing steps of a semiconductor device and FIG. 10B is a schematic perspective view of the semiconductor device.

FIG. 10a shows an example where the semiconductor device described in the foregoing embodiments is used to make an electronic component. Note that an electronic component is also referred to as a semiconductor package or an IC package. For the electronic component, there are a variety of standards and names corresponding to the direction of terminals or the shape of terminals; hence, one example of the electronic component will be described in this embodiment.

A semiconductor device including the transistors illustrated in FIGS. 7a to 7d, FIGS. 8a and 8b, and FIGS. 9a and 9b of Embodiment 3 undergoes the assembly process (post-process) and is completed by using a combination of components detachable to a printed circuit board.

The post-process can be completed through steps shown in FIG. 10a. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that a circuit unit and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The electronic component described above includes the semiconductor device of the foregoing embodiments; thus, the electronic component including the semiconductor device which has excellent tolerance to high voltage and electrical characteristics in a high-temperature environment can be provided. In other words, the electronic component has high electrical tolerance to voltage and excellent electrical characteristics at high temperatures.

Figure 10B:
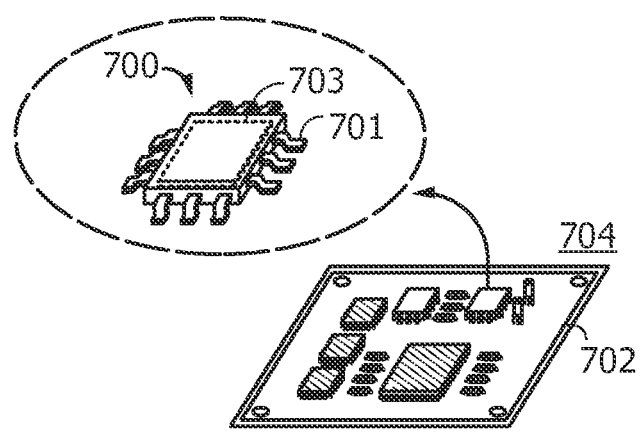

FIG. 10b is a schematic perspective diagram of a completed electronic component. FIG. 10b is a schematic perspective diagram of a quad flat package (QFP) as an example of the electronic component. An electronic component 700 illustrated in FIG. 10b includes a lead 701 and a semiconductor device 703. The electronic component 700 in FIG. 10b is, for example, mounted on a printed circuit board 702. A plurality of electronic components 700 are used in combination to be electrically connected to each other over the printed circuit board 702; thus, a board on which the electronic components are mounted (a mounted board 704) is completed. The completed mounted board 704 is provided in an electronic device or the like.

Then, applications of the electronic component to an electronic device such as a computer, a portable information terminal (including a cellular phone, a portable game machine, an audio reproducing device, and the like), electronic paper, a television device (also referred to as a television or a television receiver), or a digital video camera are described.

Figure 11A:
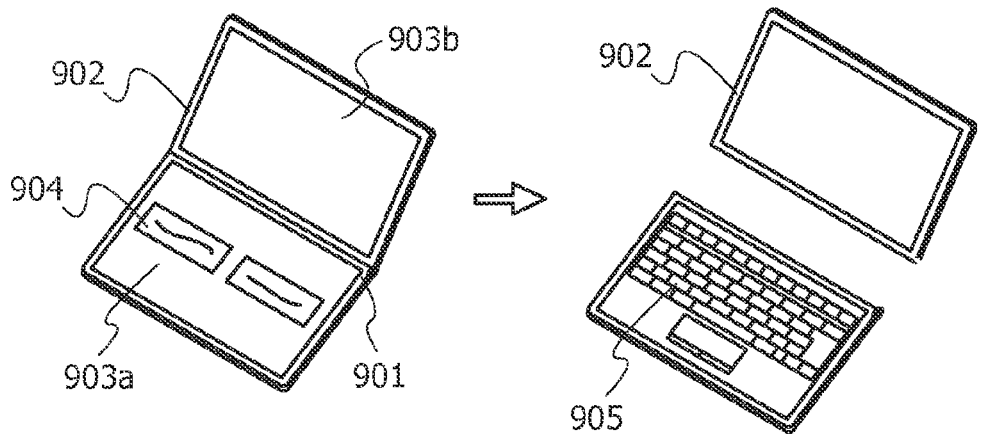
FIGS. 11A to 11E each illustrate an electronic device using a semiconductor device.

FIG. 11a illustrates a portable information terminal, which includes a housing 901, a housing 902, a first display portion 903a, a second display portion 903b, and the like. At least one of the housings 901 and 902 includes a circuit board including the semiconductor device described in the above embodiments. Thus, a portable information terminal that has excellent electrical tolerance to voltage and electrical characteristics at high temperatures is obtained.

Note that the first display portion 903a is a touch panel, and for example, as illustrated in the left of FIG. 11a, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 11a. With the keyboard 905, letters can be input quickly by keyboard input as in the case of using a conventional information terminal, for example.

Furthermore, one of the first display portion 903a and the second display portion 903b can be detached from the portable information terminal as illustrated in the right in FIG. 11a. The second display portion 903b can also function as a touch panel for a reduction in weight to carry around to be operated by one hand while the other hand supports the housing 902, which is convenient.

The portable information terminal in FIG. 11a can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 11a may transmit and receive data wirelessly. Through wireless communication, desired book data or the like can be purchased and downloaded from an electronic book server.

Furthermore, the housing 902 in FIG. 11a may have an antenna, a microphone function, or a wireless communication function to be used as a cellular phone.

Figure 11B:
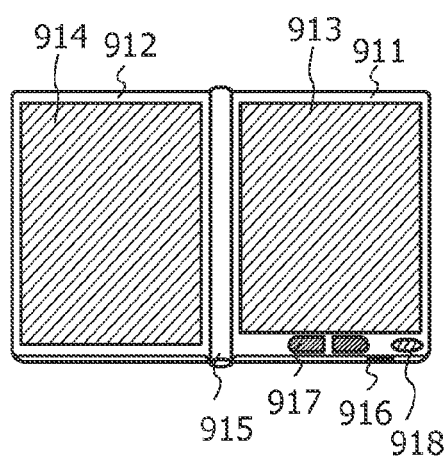

FIG. 11b illustrates an e-book reader including electronic paper. The e-book reader includes two housings 911 and 912. The housing 911 and the housing 912 include a display portion 913 and a display portion 914, respectively. The housings 911 and 912 are connected to each other by a hinge 915, so that the e-book reader can be opened and closed using the hinge 915 as an axis. The housing 911 includes a power button 916, operation keys 917, a speaker 918, and the like. A circuit board on which the semiconductor device described in the above embodiments is provided is mounted on at least one of the housings 911 and 912. Thus, an e-book reader that has excellent electrical tolerance to voltage and electrical characteristics at high temperatures is obtained.

Figure 11C:
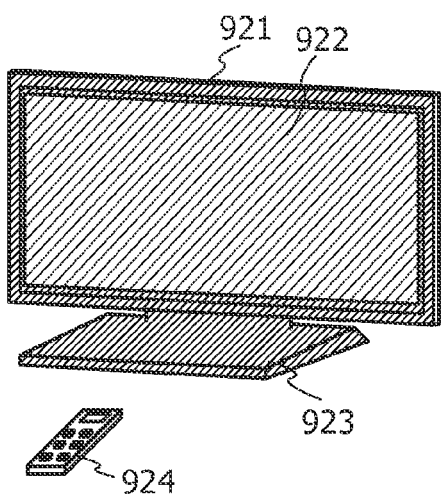

FIG. 11c is a television device, which includes a housing 921, a display portion 922, a stand 923, and the like. The television device can be operated with a switch of the housing 921 and a remote control 924. A circuit board on which the semiconductor device described in the above embodiments is provided is mounted on the housing 921 and the remote control 924. Thus, a television device that has excellent electrical tolerance to voltage and electrical characteristics at high temperatures is obtained.

Figure 11D:
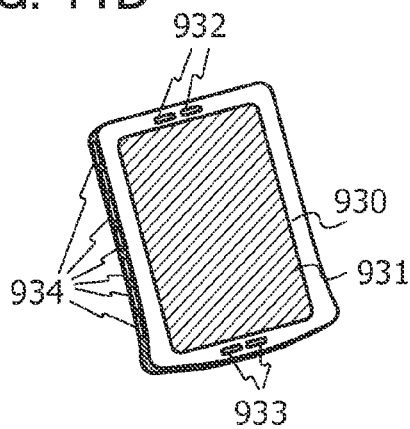

FIG. 11d illustrates a smartphone in which a main body 930 includes a display portion 931, a speaker 932, a microphone 933, operation buttons 934, and the like. A circuit board on which the semiconductor device described in the above embodiments is provided is mounted on the main body 930. Thus, a smartphone that has excellent electrical tolerance to voltage and electrical characteristics at high temperatures is obtained.

Figure 11E:
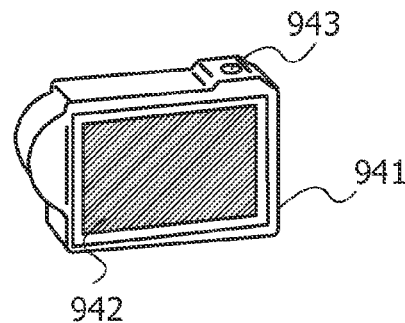

FIG. 11*e* illustrates a digital camera, which includes a main body 941, a display portion 942, an operation switch 943, and the like. A circuit board on which the semiconductor device described in the above embodiments is provided is mounted on the main body 941. Thus, a digital camera that has excellent electrical tolerance to voltage and electrical characteristics at high temperatures is obtained.

As described above, a circuit broad on which the semiconductor device described in the above embodiments is provided is mounted on each of the electronic devices described in this embodiment. Thus, an electronic device that has excellent electrical tolerance to voltage and electrical characteristics at high temperatures is obtained.

This application is based on Japanese Patent Application serial no. 2013-200707 filed with Japan Patent Office on Sep. 27, 2013, the entire contents of which are hereby incorporated by reference.

What is claimed is:

1. A semiconductor device comprising:
   a first transistor;
   a second transistor;
   a third transistor;
   a fourth transistor;
   a fifth transistor; and
   a sixth transistor,
   wherein a gate of the first transistor, a gate of the third transistor, a gate of the fifth transistor, a second terminal of the third transistor, and a first terminal of the fourth transistor are electrically connected to one another,
   wherein a second terminal of the first transistor, a first terminal of the second transistor, and a gate of the fourth transistor are electrically connected to one another,
   wherein a second terminal of the fifth transistor and a first terminal of the sixth transistor are electrically connected to one another,
   wherein each of the first transistor, the third transistor, and the fifth transistor comprises a back gate electrode,
   wherein a first terminal of the first transistor, a first terminal of the third transistor, and a first terminal of the fifth transistor are electrically connected to a first power supply line, and
   wherein a second terminal of the second transistor, a second terminal of the fourth transistor, and a second terminal of the sixth transistor are directly connected to a second power supply line.

2. The semiconductor device according to claim 1,
   wherein each of the first transistor, the third transistor, and the fifth transistor comprises an oxide semiconductor layer comprising a channel formation region.

3. The semiconductor device according to claim 1, further comprising a seventh transistor and an eighth transistor,
   wherein a gate of the seventh transistor, a second terminal of the seventh transistor, and a first terminal of the eighth transistor are electrically connected to an output terminal,
   wherein the second terminal of the fifth transistor, the first terminal of the sixth transistor, and a gate of the eighth transistor are electrically connected to one another, and
   wherein the seventh transistor comprises a back gate electrode.

4. The semiconductor device according to claim 3,
   wherein each of the first transistor, the third transistor, the fifth transistor, and the seventh transistor comprises an oxide semiconductor layer comprising a channel formation region.

5. The semiconductor device according to claim 3,
   wherein a first terminal of the seventh transistor is electrically connected to the first power supply line, and
   wherein a second terminal of the eighth transistor is electrically connected to the second power supply line.

6. The semiconductor device according to claim 3,
   wherein the first to eighth transistors have the same polarity.

7. A semiconductor device comprising:
   a first transistor;
   a second transistor;
   a third transistor;
   a fourth transistor;
   a fifth transistor; and
   a sixth transistor,
   wherein a gate of the first transistor, a gate of the third transistor, a gate of the fifth transistor, a second terminal of the third transistor, and a first terminal of the fourth transistor are electrically connected to one another,
   wherein a second terminal of the first transistor, a first terminal of the second transistor, and a gate of the fourth transistor are electrically connected to one another,
   wherein a second terminal of the fifth transistor and a first terminal of the sixth transistor are electrically connected to one another,
   wherein each of the first transistor, the third transistor, and the fifth transistor comprises a back gate electrode,
   wherein a first terminal of the first transistor, a first terminal of the third transistor, and a first terminal of the fifth transistor are electrically connected to a first power supply line,
   wherein a second terminal of the second transistor, a second terminal of the fourth transistor, and a second terminal of the sixth transistor are directly connected to a second power supply line,
   wherein a first signal is supplied to a gate of the second transistor,
   wherein a second signal is supplied to a gate of the sixth transistor,
   wherein a signal is output from the first terminal of the sixth transistor, and
   wherein the signal is determined by comparing the first signal and the second signal.

8. The semiconductor device according to claim 7,
   wherein each of the first transistor, the third transistor, and the fifth transistor comprises an oxide semiconductor layer comprising a channel formation region.

9. The semiconductor device according to claim 7, further comprising a seventh transistor and an eighth transistor,
   wherein a gate of the seventh transistor, a second terminal of the seventh transistor, and a first terminal of the eighth transistor are electrically connected to an output terminal,
   wherein the second terminal of the fifth transistor, the first terminal of the sixth transistor, and a gate of the eighth transistor are electrically connected to one another,
   wherein the seventh transistor comprises a back gate electrode,
   wherein an output signal is output from the output terminal, and wherein the output signal is determined by comparing the first signal and the second signal.

10. The semiconductor device according to claim 9,
wherein each of the first transistor, the third transistor, the fifth transistor, and the seventh transistor comprises an oxide semiconductor layer comprising a channel formation region.

11. The semiconductor device according to claim 9,
wherein a first terminal of the fifth transistor, and a first terminal of the seventh transistor is electrically connected to the first power supply line, and
wherein a second terminal of the eighth transistor is electrically connected to the second power supply line.

12. The semiconductor device according to claim 9,
wherein the first to eighth transistors have the same polarity.

13. A semiconductor device comprising:
a first transistor;
a second transistor;
a third transistor;
a fourth transistor;
a fifth transistor; and
a sixth transistor,
wherein a gate of the first transistor, a gate of the third transistor, a gate of the fifth transistor, a second terminal of the third transistor, and a first terminal of the fourth transistor are electrically connected to one another,
wherein a second terminal of the first transistor, a first terminal of the second transistor, and a gate of the fourth transistor are electrically connected to one another,
wherein a second terminal of the fifth transistor and a first terminal of the sixth transistor are electrically connected to one another,
wherein each of the first transistor, the third transistor, and the fifth transistor comprises a back gate electrode,
wherein a first terminal of the first transistor, a first terminal of the third transistor, and a first terminal of the fifth transistor are electrically connected to a first power supply line,
wherein a second terminal of the second transistor, a second terminal of the fourth transistor, and a second terminal of the sixth transistor are directly connected to a second power supply line,
wherein a first signal is supplied to a gate of the second transistor,
wherein a second signal is supplied to a gate of the sixth transistor,
wherein a signal is output from the first terminal of the sixth transistor,
wherein the signal is determined by comparing the first signal and the second signal, and
wherein a control signal is supplied to the back gate electrode of each of the first transistor, the third transistor, and the fifth transistor to make the first transistor, the third transistor, and the fifth transistor conductive in a period during which the signal is output and make the first transistor, the third transistor, and the fifth transistor non-conductive in the other period.

14. The semiconductor device according to claim 13,
wherein each of the first transistor, the third transistor, and the fifth transistor comprises an oxide semiconductor layer comprising a channel formation region.

15. The semiconductor device according to claim 13, further comprising a seventh transistor and an eighth transistor,
wherein a gate of the seventh transistor, a second terminal of the seventh transistor, and a first terminal of the eighth transistor are electrically connected to an output terminal,
wherein the second terminal of the fifth transistor, the first terminal of the sixth transistor, and a gate of the eighth transistor are electrically connected to one another,
wherein the seventh transistor comprises a back gate electrode,
wherein an output signal is output from the output terminal,
wherein the output signal is determined by comparing the first signal and the second signal, and
wherein the control signal is supplied to the back gate electrode of each of the first transistor, the third transistor, the fifth transistor, and the seventh transistor to make the first transistor, the third transistor, the fifth transistor, and the seventh transistor conductive in the period during which the output signal is output and make the first transistor, the third transistor, the fifth transistor, and the seventh transistor non-conductive in the other period.

16. The semiconductor device according to claim 15,
wherein each of the first transistor, the third transistor, the fifth transistor, and the seventh transistor comprises an oxide semiconductor layer comprising a channel formation region.

17. The semiconductor device according to claim 15,
wherein a first terminal of the seventh transistor is electrically connected to the first power supply line, and
wherein a second terminal of the eighth transistor is electrically connected to the second power supply line.

18. The semiconductor device according to claim 15,
wherein the first to eighth transistors have the same polarity.

* * * * *

UNITED STATES PATENT AND TRADEMARK OFFICE
CERTIFICATE OF CORRECTION

PATENT NO.         : 9,653,486 B2                                      Page 1 of 1
APPLICATION NO.    : 14/492644
DATED              : May 16, 2017
INVENTOR(S)        : Yoshiyuki Kurokawa It is certified that error appears in the above-identified patent and that said Letters Patent is hereby corrected as shown below:

In the Specification

At Column 3, Line 29, "dram." should be --drain.--;

At Column 7, Line 67, "Yin" should be --Vin--;

At Column 12, Line 42, "semiconductor includes" should be --semiconductor film includes--;

At Column 14, Line 19, "cap" should be --can--;

In the Claims

In Claim 11, at Column 21, Line 9, "a first terminal of the fifth transistor, and" should be deleted.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*